(12) United States Patent
Tong et al.

(10) Patent No.: US 11,513,177 B2
(45) Date of Patent: Nov. 29, 2022

(54) BALUN ASSEMBLY AND MAGNETIC RESONANCE IMAGING SYSTEM

(71) Applicant: GE Precision Healthcare LLC, Wauwatosa, WI (US)

(72) Inventors: Sheng Tong, Beijing (CN); Yue Shang, Beijing (CN); Haoyang Xing, Beijing (CN); Zhuoyu Chen, Beijing (CN); Liya Ma, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 48 days.

(21) Appl. No.: 17/304,356

(22) Filed: Jun. 18, 2021

(65) Prior Publication Data

US 2021/0396826 A1 Dec. 23, 2021

(30) Foreign Application Priority Data

Jun. 23, 2020 (CN) .......................... 202021177967.4

(51) Int. Cl.
*G01R 33/42* (2006.01)
*G01R 33/36* (2006.01)
*G01R 33/422* (2006.01)

(52) U.S. Cl.
CPC ....... *G01R 33/3685* (2013.01); *G01R 33/422* (2013.01)

(58) Field of Classification Search
CPC ................ G01R 33/00; G01R 33/0035; G01R 33/0023; G01R 33/0017; G01R 31/3191; G01R 33/3685; G01R 33/422; G01B 7/004; G01C 17/38; G06F 3/017; G06F 3/0346; G06F 3/012
See application file for complete search history.

(56) References Cited

U.S. PATENT DOCUMENTS

| | | | |
|---|---|---|---|
| 8,412,306 B2 * | 4/2013 | Kurpad | G01R 33/287 600/411 |
| 2017/0343628 A1 * | 11/2017 | Taracila | G01R 33/307 |
| 2021/0325487 A1 * | 10/2021 | Tanielian | G01R 33/0088 |

FOREIGN PATENT DOCUMENTS

CN 107240749 A 10/2017

* cited by examiner

*Primary Examiner* — Jermele M Hollington
*Assistant Examiner* — Taqi R Nasir

(57) ABSTRACT

An embodiment of the present utility model relates to a balun assembly, including: an outer conductive tube body disposed around an electrical cable, the outer conductive tube body including a first portion and a second portion detachably connected to each other; a conductive connection member electrically connecting the outer conductive tube body to the electrical cable; and an insulative material disposed between the outer conductive tube body and the electrical cable. An embodiment of the present utility model further relates to a magnetic resonance device including the balun assembly.

10 Claims, 7 Drawing Sheets

000
BALUN ASSEMBLY AND MAGNETIC RESONANCE IMAGING SYSTEM

CROSS-REFERENCE TO RELATED APPLICATIONS

This application claims priority pursuant to 35 U.S.C. 119(a) to Chinese Patent Application No. 202021177967.4 filed on Jun. 23, 2020, the disclosure of which is herein incorporated by reference in its entirety.

TECHNICAL FIELD

The present utility model relates to the medical field, and in particular, to a balun assembly and a magnetic resonance imaging system including the balun assembly.

BACKGROUND

A balun, which is an abbreviation of "balanced-unbalanced converter," is typically added between an antenna and an electrical cable and used to convert an unbalanced signal into a balanced signal and to limit a current flowing out of a shielding layer of the electrical cable. Baluns have wide applications in magnetic resonance systems, especially in magnetic resonance radio-frequency coils. A balun is a key design component, because during radio-frequency transmission of a magnetic resonance system, a strong alternating magnetic field and alternating electric field inside the system can induce strong radio-frequency currents in electrical cables, and ineffective containment of the radio-frequency currents can cause radio-frequency coils to fail to perform imaging normally, and can result in serious safety hazards, and may even cause patients burn injuries.

A common conventional "bazooka"-shaped balun is cylindrical, and is provided sequentially from inside to outside with an inner conductive tube body, an insulative cylinder (usually an insulative plastic body) and an outer conductive tube body. An end surface ring conductor is disposed on an end surface of one end of the insulative cylinder. An inner side edge and an outer side edge of the end surface ring conductor are respectively connected to the inner conductive tube body and the outer conductive tube body, thereby connecting the inner conductive tube body and the outer conductive tube body to each other. The inner conductive tube body, the end surface ring conductor, and the outer conductive tube body define a semi-enclosed space to form an inductor. A ceramic capacitor is provided on an end surface of the other end of the insulative cylinder. An electrode of the ceramic capacitor is soldered to the inner conductive tube body, and another electrode is soldered to the outer conductive tube body. The inner conductive tube body, the end surface ring conductor, the outer conductive tube body, and the ceramic capacitor form a resonant loop. The resonant loop and the electrical cable passing through the balun are mutually inductively coupled so that a current flowing out of the shielding layer of the electrical cable can be effectively limited.

However, preparation of the aforementioned conventional balun is generally cumbersome, and the insulative plastic body thereof needs to be separately machined or manufactured by means of molding, resulting in a complex process and high costs. The inner conductive tube body in the insulative plastic body and the outer conductive tube body are usually made from a thin copper sheet cut into certain shapes and bonded to the interior and the exterior of the insulative plastic body by means of a double-sided adhesive tape, resulting in technical complexity and poor reliability. In addition, a plastic insulator has a solid structure, and is therefore heavy, thereby affecting use of a coil. Furthermore, the aforementioned conventional balun is extremely difficult to mount, and cannot achieve both high performance and high reliability, greatly limiting the design of a body coil.

SUMMARY

In view of this, embodiments of the present utility model provide a balun assembly and a magnetic resonance device comprising the balun assembly, thereby effectively solving or alleviating at least one of the currently existing problems.

An aspect of the embodiments of the present utility model relates to a balun assembly, wherein the balun assembly comprises:

an outer conductive tube body disposed around an electrical cable, the outer conductive tube body comprising a first portion and a second portion detachably connected to each other;

a conductive connection member electrically connecting the outer conductive tube body to an outer conductor of the electrical cable; and an insulative material disposed between the outer conductive tube body and the electrical cable.

In the balun assembly according to an embodiment of the present utility model, optionally the outer conductive tube body is coaxial with the electrical cable.

In the balun assembly according to an embodiment of the present utility model, optionally the first portion and the second portion are connected to each other by means of a fastening connection member.

In the balun assembly according to an embodiment of the present utility model, optionally the conductive connection member is integrally formed with the outer conductive tube body.

In the balun assembly according to an embodiment of the present utility model, optionally the outer conductive tube body comprises an axially extending portion and a radially extending portion, and the conductive connection member comprises a plurality of contacts extending integrally from an inner wall of the axially extending portion or a plurality of contacts extending integrally from an inner wall of the radially extending portion.

In the balun assembly according to an embodiment of the present utility model, optionally the contact comprises an elastic piece structure, and the plurality of contacts are evenly distributed in a substantially circumferential direction of the outer conductive tube body, and contact the outer conductor of the electrical cable at a plurality of positions in a circumferential direction of the electrical cable.

In the balun assembly according to an embodiment of the present utility model, optionally the insulative material forms an inner wall substantially adapted to the electrical cable so as to support the electrical cable.

In the balun assembly according to an embodiment of the present utility model, optionally the balun assembly further comprises a capacitor electrically connected to the outer conductive tube body.

In the balun assembly according to an embodiment of the present utility model, optionally the balun assembly further comprises a heat dissipation structure connected to the outer conductive tube body, the heat dissipation structure comprising a first heat sink connected to the first portion and a second heat sink connected to the second portion.

Another aspect of the embodiments of the present utility model relates to a magnetic resonance imaging system, wherein the magnetic resonance imaging system comprises the balun assembly according to any one of the aforementioned embodiments.

BRIEF DESCRIPTION OF THE DRAWINGS

Exemplary embodiments of the present utility model are shown in the following accompanying drawings, in which.

DETAILED DESCRIPTION OF THE EMBODIMENTS

Some embodiments of the present utility model will be described below in more detail with reference to the drawings. Unless otherwise clearly defined herein, the meanings of technical terms used herein refer to meanings generally understood by those skilled in the art.

The terms "comprising", "having", and similar terms used herein mean that other items may also be included in the scope in addition to the items listed thereafter and their equivalents. The term "or" does not imply exclusion, but refers to the existence of at least one of the items mentioned, and encompasses the situation that a combination of the items mentioned exists. The term "and/or" includes any and all combinations of one or more of the items mentioned. "An embodiment," "some embodiments," etc., mentioned herein mean that a specific element (such as feature, structure and/or feature) related to the present utility model is included in at least one embodiment described in the description and may or may not appear in other embodiments. In addition, it needs to be understood that the elements of the present utility model may be combined in any appropriate manner.

Herein, when a component is referred to as "fixed to", "mounted to," or "connected to" (or similar terms) another component, it can be directly fixed, mounted or connected to the other component, or indirectly fixed, mounted or connected to the other component through other intermediate elements. In addition, "connected" or "interconnected" includes, but is not limited to, mechanical connection and electrical connection, may mean direct connection, and may also mean indirect connection. Two components connected or interconnected may be two independent components that are directly connected to each other or indirectly connected to each other by means of a connecting device, or two components (namely, two portions of a whole) integrally formed together.

Figure 1:
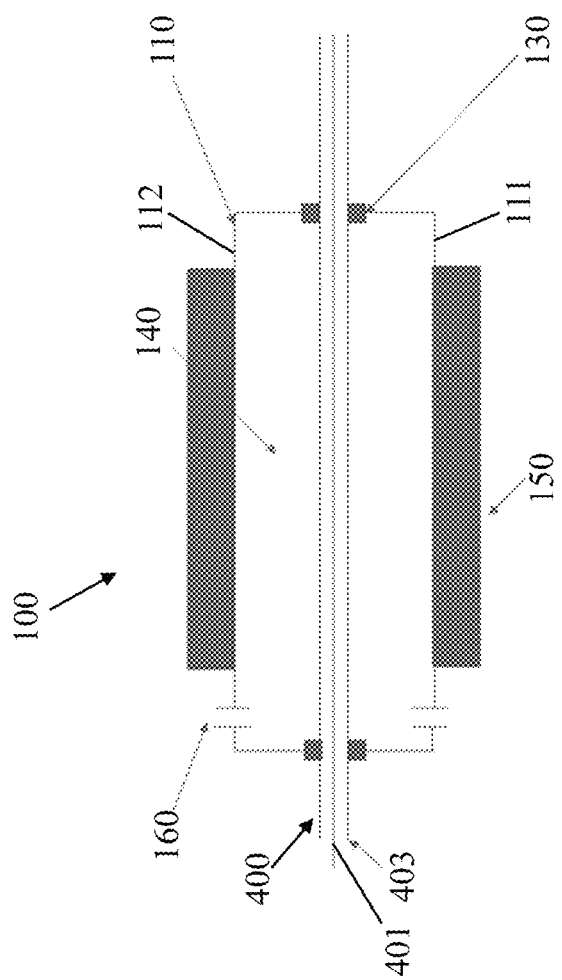
FIG. 1 is a schematic diagram of an exemplary balun assembly and an electrical cable therein according to an embodiment of the present utility model.

FIG. 1 shows a schematic diagram of an exemplary balun assembly 100 according to an embodiment of the present utility model. As shown in FIG. 1, the balun assembly 100 may be sleeved on an electrical cable 400, and the balun assembly 100 may include an insulative material 140, an outer conductive tube body 110, and an optional heat dissipation structure 150 disposed sequentially in a direction from the electrical cable 400 towards the outside. The electrical cable 400 includes a central pin 401 and an outer conductor 403. The outer conductive tube body 110 includes a first portion 111 and a second portion 112 detachably connected to each other by means of a fastening connection member (not shown, an applicable fastening connection member including but not limited to a snap element or a fastener (e.g., a bolt, a pin, or the like)), and the outer conductive tube body 110 is electrically connected to the outer conductor (an outer conductive shielding layer) 403 (serving as an inner conductive tube body of the balun assembly) of the electrical cable 400 by means of a conductive connection member 130. A capacitor 160 for frequency tuning is further electrically connected to the outer conductive tube body 110. A resonant loop is formed by the outer conductor 403 of the cable 400, the outer conductive tube body 110, and the capacitor 160. The resonant loop and the electrical cable 400 passing through the balun assembly 100 are mutually inductively coupled to each other, thereby effectively suppressing a common mode current on the electrical cable 400 without affecting a differential mode current. The resonant loop described above is merely an example of a circuit model formed by the balun assembly of the embodiment of the present invention, and in different applications, the balun assembly has a variety of circuit models and different functions.

Figure 2:
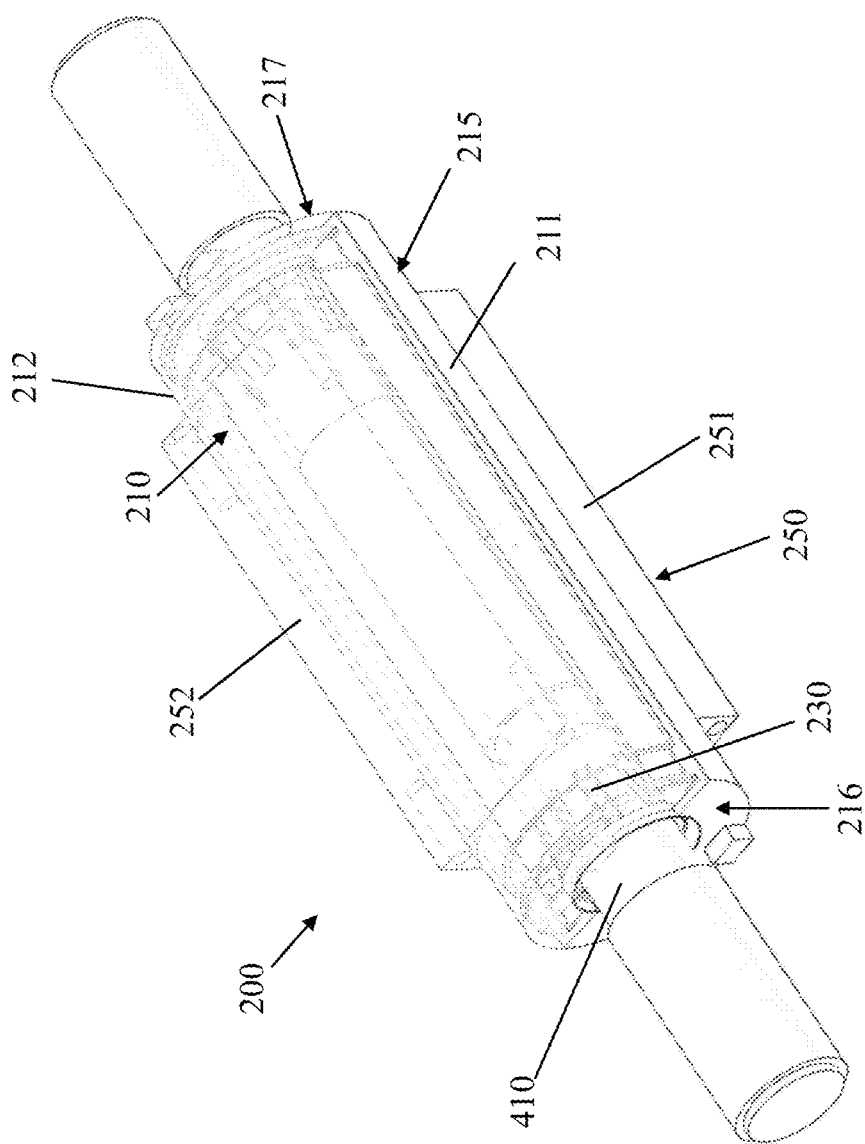
FIG. 2 shows a perspective view of an exemplary balun assembly mounted on an electrical cable according to an embodiment of the present utility model, wherein a portion of the balun assembly is transparent to better show an internal structure thereof.
Figure 3:
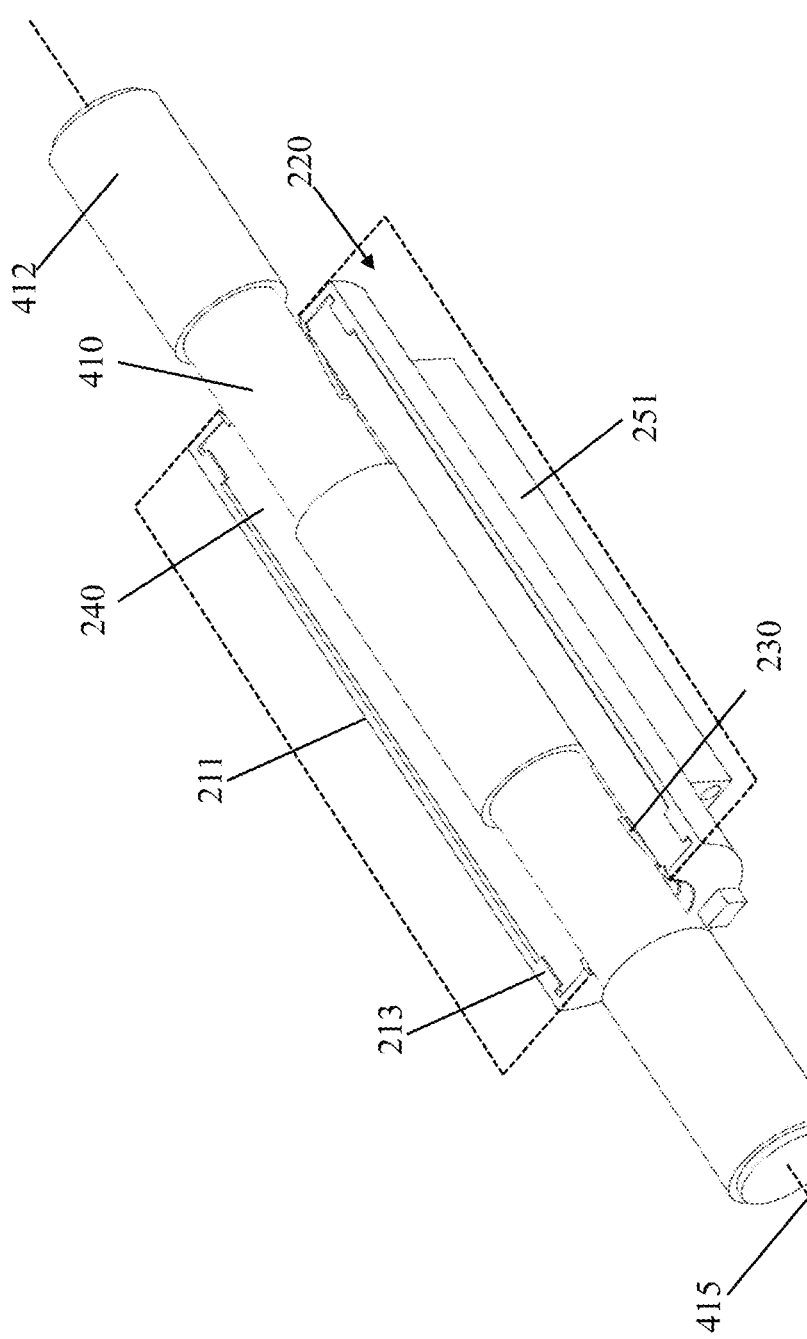
FIG. 3 shows a partial cross-sectional perspective view of the balun assembly shown in FIG. 2.

FIG. 2 and FIG. 3 show an exemplary balun assembly (typically, a magnetic resonance balun assembly) 200 according to an embodiment of the present utility model. The balun assembly 200 includes an outer conductive tube body 210, and the outer conductive tube body 210 is coaxial with and disposed around an electrical cable 410. The outer conductive tube body 210 may be in the form of a conductive housing, i.e., a housing made from a conductive material. An insulative material (described in detail later) for supporting the electrical cable 410 may be accommodated in the outer conductive tube body 210. The outer conductive tube body 210 includes a first portion 211 and a second portion 212 detachably connected to each other. In some embodiments, the first portion 211 and the second portion 212 are respectively two halves, such as an upper half and a lower half, that form the outer conductive tube body 210. In some embodiments, an assembly face 220 between the first portion 211 and the second portion 212 passes through an axis 415 of the electrical cable 410, i.e., the axis 415 of the electrical cable 410 is within the assembly face 220 between the first portion 211 and the second portion 212. In some embodiments, the first portion 211 and the second portion 212 are assembled together by means of a fastening connection member. In the illustrated embodiment, a plurality of snap structures 213 are provided on the first portion 211, and corresponding snap structures (not shown in the drawing) are provided on the second portion 212. The snap structures of the first portion 211 and the snap structures of the second portion 212 engage with each other so as to assemble the first portion 211 and the second portion 212 together in a detachable manner.

The outer conductive tube body 210 may include an axially extending portion 215 and radially extending portions 216, 217, where the axially extending portion 215 provides an outer peripheral surface of the outer conductive tube body 210, and the radially extending portions 216, 217 provide two axial end surfaces of the outer conductive tube body 210. Correspondingly, the first portion 211 and the second portion 212 of the outer conductive tube body 210 may include corresponding portions of the axially extending portion 215 and the radially extending portions 216, 217.

The balun assembly 200 further includes a conductive connection member 230 that electrically connects the outer conductive tube body 210 to the electrical cable 410, and an insulative material 240 disposed between the outer conductive tube body 210 and the electrical cable 410. The conductive connection member 230 may be integrally formed with the outer conductive tube body 210. For example, in some embodiments, the conductive connection member 230 includes a contact such as an elastic piece structure or the like, where the contact extends integrally from an inner wall of the axially extending portion 215 of the outer conductive tube body 210 radially inwards, passes through the insulative material 240, and abuts the electrical cable 410, or the contact extends integrally from inner walls of the radially extending portions 216 and/or 217 of the outer conductive tube body 210 axially towards the center, and abuts the electrical cable 410. The contact not only can maintain an electrical connection to an outer conductor of the electrical cable 410 in the assembly 200, but can also be easily detached from the electrical cable 410 since the contact contacts the electrical cable 410 by abutting the same. In some embodiments, the conductive connection member 230 may include a plurality of contacts evenly distributed in a substantially circumferential direction of the outer conductive tube body 210, and the plurality of contacts can contact the outer conductor of the electrical cable 410 at a plurality of positions in a circumferential direction of the electrical cable 410.

In some embodiments, corresponding to the first portion 211 and the second portion 212 of the outer conductive tube body 210, the insulative material 240 may include a first insulative material portion located within the first portion 211 (located between the first portion 211 and the electrical cable 410 after assembly) and a second insulative material portion located within the second portion 212 (located between the second portion 212 and the electrical cable 410 after assembly). When the first portion 211 and the second portion 212 of the outer conductive tube body 210 are disassembled, the first insulative material portion and the second insulative material portion can be separated; when the first portion 211 and the second portion 212 of the outer conductive tube body 210 are connected to each other, the first insulative material portion and the second insulative material portion can combine to support the electrical cable 410 in the balun assembly. The insulative material 240 may be made from a light material or a hollow material according to design requirements, so as to reduce the overall weight of the balun assembly 200. In some embodiments, a cable reel jack 412 may be further wrapped around the electrical cable 410 (except at a position where the electrical cable 410 contacts the conductive connection member 230).

In addition, the balun assembly 200 may be further provided with a heat dissipation structure 250 connected to the outer conductive tube body 210. In some embodiments, the heat dissipation structure 250 includes a first heat sink 251 connected to the first portion 211 and a second heat sink 252 connected to the second portion 212. Since a balun has extremely high resistance on a shielding layer of a radio-frequency cable, the balun is a hot location on a body coil. Thus, improving balun performance may cause the balun to have heating problems and reduce reliability. However, poor balun performance may affect resonance of the body coil, and may result in unstable tuning. Therefore, the design of the heat dissipation structure can solve the heating problems while allowing good balun performance to be achieved.

An outer side of the balun assembly 200 is provided by the outer conductive tube body 210, and an inner side thereof is substantially provided by the insulative material 240. The outer-side shape of the balun assembly 200 provided by the outer conductive tube body 210 (the shape of the outer conductive tube body 210) is not limited, and may be designed according to specific requirements. For example, the outer conductive tube body 210 may be cylindrical or cuboid. For example, the conductive tube body 210 shown in FIG. 2 and FIG. 3 is cylindrical. The inner side of the balun assembly 200 substantially provided by the insulative material 240 may be shaped to provide some support for the electrical cable 410 therein. For example, an inner wall formed by the insulative material 240 may be substantially adapted to the peripheral shape of the electrical cable 410 so as to provide full support for the electrical cable 410 (which will be further described later with reference to FIG. 4 and FIG. 5). In some other embodiments, the inner wall formed by the insulative material 240 may also not necessarily conform to the electrical cable 410, but only need to contact and support the electrical cable 410 at certain portions.

In addition, the balun assembly 200 typically further includes one or more capacitors (not shown) electrically connected to the outer conductive tube body 210. As described above with reference to FIG. 1, the capacitor may form a resonant loop together with the outer conductive tube body 210 and the outer conductor of the electrical cable 410. The capacitor may be mounted at any suitable position on the outer conductive tube body 210, for example, at a position that facilitates heat dissipation performed by the heat dissipation structure 250.

Figure 4:
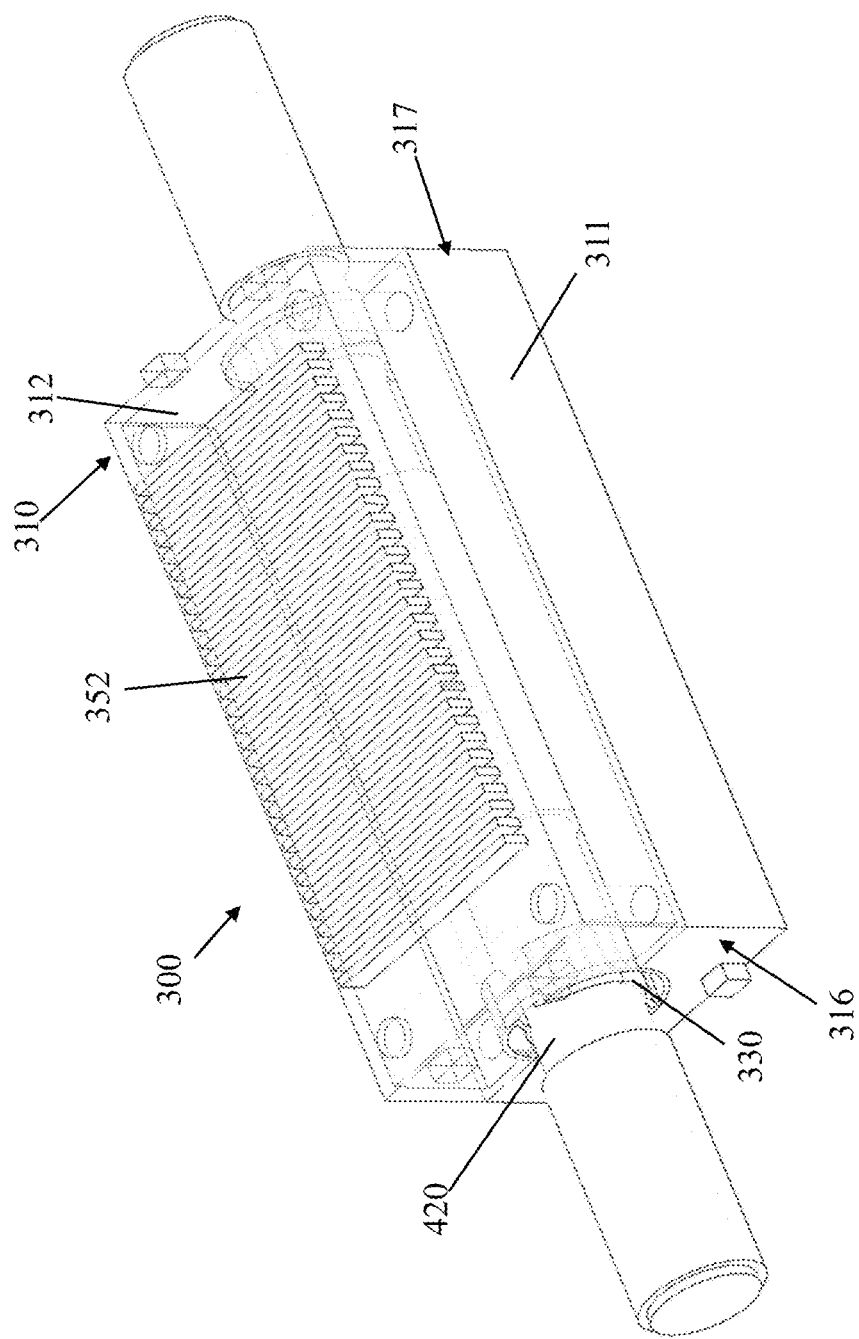
FIG. 4 shows a perspective view of another exemplary balun assembly mounted on an electrical cable according to an embodiment of the present utility model, wherein a portion of the balun assembly is transparent to better show an internal structure thereof.
Figure 5:
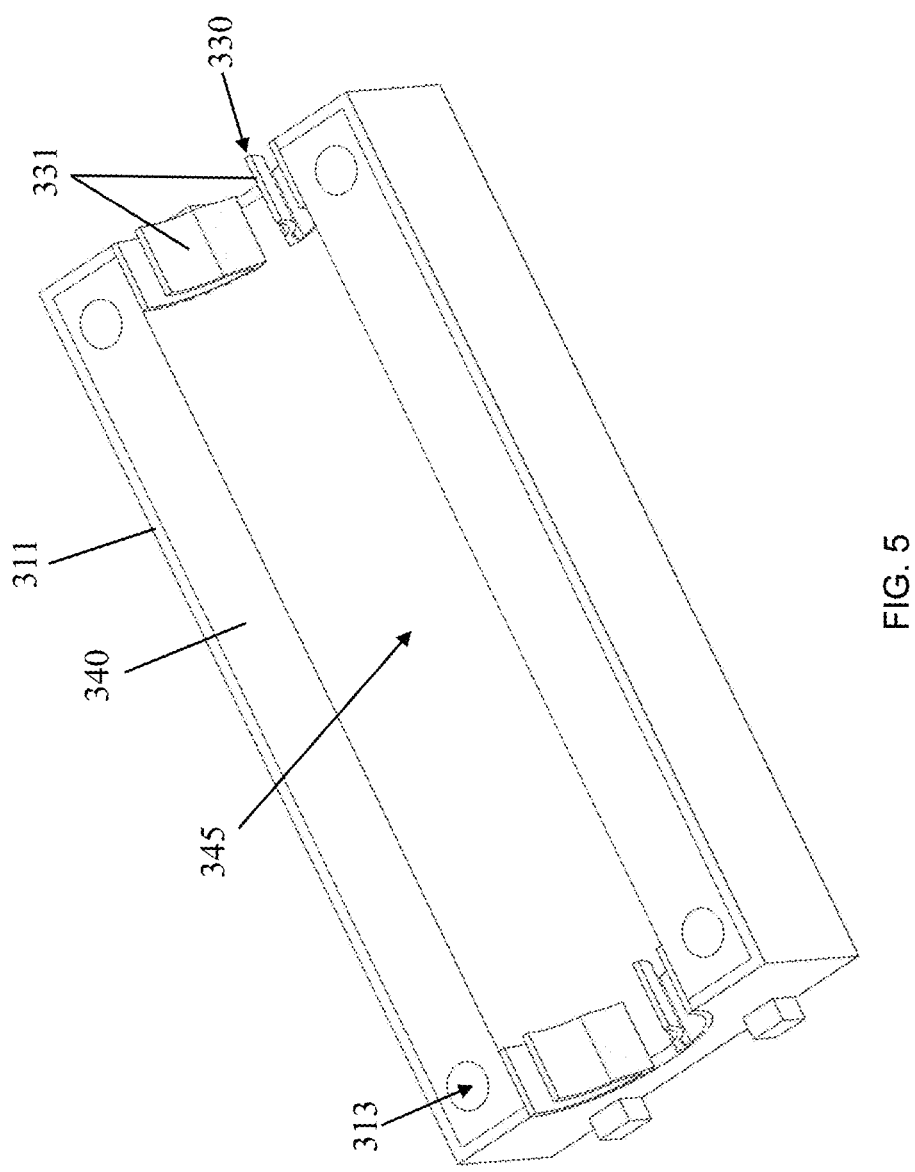
FIG. 5 shows a partial cross-sectional perspective view of the balun assembly shown in FIG. 4.

FIG. 4 and FIG. 5 show another exemplary balun assembly 300 according to an embodiment of the present utility model. Similar to the balun assembly 200 shown in FIG. 2 and FIG. 3, the assembly 300 includes an outer conductive tube body 310 coaxial with and disposed around an electrical cable 420, a conductive connection member 330 electrically connecting the outer conductive tube body 310 to the electrical cable 420, and an insulative material 340 disposed between the outer conductive tube body 310 and the electrical cable 420. The outer conductive tube body 310 includes a first portion 311 and a second portion 312 detachably connected to each other. Different from the assembly 200, the first portion 311 and the second portion 312 of the outer conductive tube body 310 in the assembly 300 are connected to each other by means of a fastener (not shown). As shown in FIG. 5, a hole 313 for receiving the fastener is provided on the first portion 311, and a corresponding fastener receiving hole is provided on the second portion 312 so that the first portion 311 and the second portion 312 may be connected to each other by means of the fastener. An inner wall 345 formed by the insulative material 340 is substantially adapted to the outer peripheral shape of the electrical cable 420, and may contact an outer surface of the electrical cable 420 so as to provide full support for the electrical cable 420. The conductive connection member 330 includes a plurality of contacts 331 extending integrally from inner walls of radially extending portions 316, 317 of the outer conductive tube body 310 axially towards the center. In the embodiment shown in FIG. 4 and FIG. 5, the contacts 331 extend from the inner walls of the radially extending portions 316, 317 of the outer conductive tube body 310 axially towards the center on a radially inner side of the inner wall 345 formed by the insulative material 340, and therefore may abut the electrical cable 420. In addition, the outer conductive tube body 310 in the assembly 300 is cuboid. A first heat sink (not shown in the drawing) is also provided on the first portion 311 of the outer conductive tube body 310, and a second heat sink 352 is provided on the second portion 312.

Since the outer conductive tube body of the balun assembly in the embodiments of the present utility model adopts a design in which detachable structures are connected to each other, portability of the balun assembly is ensured on the one hand, and maintenance costs of the balun assembly are greatly reduced on the other hand. Specifically, in the balun assembly in the embodiments of the present utility model, the conductive connection member 130, 230, or 330 in the form of, for example, an elastic piece may be adopted, and contact an outer conductive layer of the electrical cable by abutting the same, thereby achieving a simple and reliable design allowing disassembly and restoration. In addition, a filler material (the insulative material) therein may be designed to be relatively soft to meet requirements for cable arrangement, or to further meet requirements for electrical length.

The balun assembly in the embodiments may typically be used in a magnetic resonance imaging (MRI) system. Another aspect of the present utility model relates to a magnetic resonance imaging system including the balun assembly.

Figure 6:
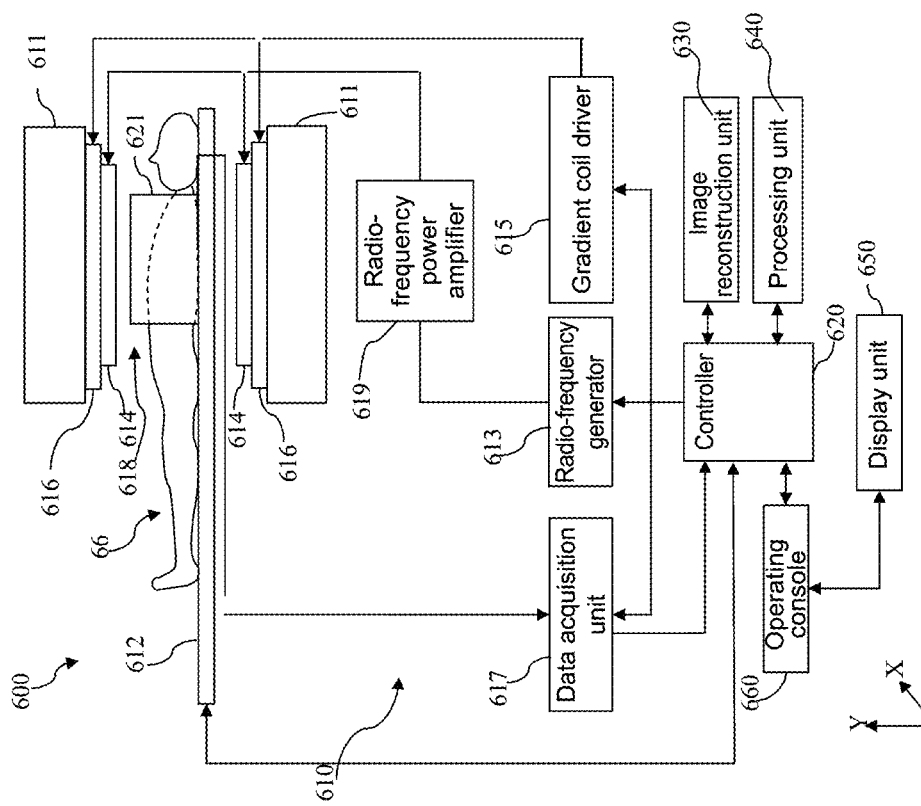
FIG. 6 shows a schematic structural diagram of a magnetic resonance imaging system that may include a balun assembly according to an embodiment.

FIG. 6 shows a schematic structural diagram of a magnetic resonance imaging system according to an embodiment. The magnetic resonance imaging system 600 includes a scanner 610. The scanner 60 is used to perform a magnetic resonance scan on an object (for example, a human body) 16 to generate image data of a region of interest of the object 66, where the region of interest may be a predetermined part or tissue to be imaged.

The magnetic resonance imaging system 600 may further include a controller 620 coupled to the scanner 610, so as to control the scanner 610 to perform the aforementioned magnetic resonance scan process. Specifically, the controller 620 may send a sequence control signal to relevant components (such as a radio-frequency generator and a gradient coil driver that will be described below) of the scanner 610 through a sequence generator (not shown in the drawing), so that the scanner 610 performs a preset scan sequence.

Those skilled in the art can understand that the aforementioned "scan sequence" refers to a combination of pulses having specific amplitudes, widths, directions, and time sequences and applied when a magnetic resonance imaging scan is performed. The pulses may usually include, for example, radio-frequency pulses and gradient pulses. The radio-frequency pulses may include, for example, a radio-frequency transmit pulse for exciting protons in the body to resonate. The gradient pulses may include, for example, a slice selection gradient pulse, a phase encoding gradient pulse, and a frequency encoding gradient pulse. Generally, a plurality of scan sequences may be preset in the magnetic resonance system so that a sequence corresponding to clinical test requirements can be selected. The clinical test requirements may include, for example, a part to be imaged, an imaging function, and the like.

In an example, the scanner 610 may include a main magnet assembly 611, a table 612, a radio-frequency generator 613, a radio-frequency transmitting coil 614, a radio-frequency receiving coil 621, a gradient coil driver 615, a gradient coil assembly 616, a radio-frequency power amplifier 619, and a data acquisition unit 617.

The main magnet assembly 611 usually includes an annular superconducting magnet defined in a housing. The annular superconducting magnet is mounted in an annular vacuum container. The annular superconducting magnet and the housing thereof define a cylindrical space surrounding the object 66, such as a scanning chamber 118 shown in FIG. 6. The main magnet assembly 611 generates a constant magnetic field, i.e., a B0 field, in a Z direction of the scanning chamber 618. Typically, a more uniform portion of the B0 field is formed in a central region of the main magnet.

The table 612 is configured to carry the object 66, and travel in the Z direction to enter or exit the scanning chamber 618 in response to the control of the controller 620. For example, in an embodiment, an imaging volume of the object 66 may be positioned at a central region of the scanning chamber with uniform magnetic field strength so as to facilitate scanning imaging of the imaging volume of the object 66.

The magnetic resonance imaging system 600 transmits a static magnetic pulse signal to the object 66 located in the scanning chamber using the formed B0 field, so that protons in resonant volumes in the body of the object 66 precess in an ordered manner to generate a longitudinal magnetization vector.

The radio-frequency generator 613 and the radio-frequency power amplifier 619 may be used as part of a radio-frequency transmission chain. The radio-frequency generator 613 is used to generate a radio-frequency pulse in response to a control signal of the controller 620. The radio-frequency pulse is usually a small radio-frequency signal having low power, and the small radio-frequency signal may be amplified by the radio-frequency power amplifier 619 and then applied to the radio-frequency transmitting coil 614. The radio-frequency transmitting coil 614 may be connected to a transmit/receive (T/R) switch. By controlling the transmit/receive switch, the body coil can be switched between a transmit mode and a receive mode. In the transmit mode, the radio-frequency transmitting coil 614 is used to, in response to the aforementioned radio-frequency pulse for excitation, transmit to the object 66 a radio-frequency field B1 orthogonal to the static magnetic field B0, so as to excite nuclei in the body of the object 66, so that the longitudinal magnetization vector is converted into a transverse magnetization vector. In the receive mode, the body coil may be used to receive a magnetic resonance signal from the object 66.

Two transmission paths (I and Q) having a 90-degree phase shift may be provided between the radio-frequency power amplifier 619 and the radio-frequency transmitting coil radio-frequency transmitting coil 614, so as to transmit an amplified radio-frequency signal to the radio-frequency transmitting coil.

After the end of the radio-frequency pulse for excitation, a free induction decay signal, namely, a magnetic resonance signal that can be acquired, is generated in the process in which the transverse magnetization vector of the object 66 is gradually restored to zero.

The gradient coil driver 615 is configured to provide a suitable current/power to the gradient coil assembly 616 in response to a gradient pulse control signal or a shimming control signal sent by the controller 620.

The gradient coil assembly 616, on one hand, forms a varying magnetic field in an imaging space so as to provide three-dimensional position information for the magnetic resonance signal, and on the other hand, generates a compensating magnetic field of the B0 field to shim the B0 field.

The gradient coil assembly 616 may include three gradient coils. The three gradient coils are respectively configured to generate magnetic field gradients inclined with respect to three spatial axes (for example, the X-axis, Y-axis, and Z-axis) perpendicular to each other. More specifically, the gradient coil assembly 616 applies a magnetic field gradient in a slice selection direction (such as the Z direction) so as to select a layer in the imaging volume. Those skilled in the art will understand that the layer is any one of a plurality of two-dimensional slices distributed in the Z direction in the three-dimensional imaging volume. The "Z direction" is generally a direction extending from the head to the feet when a patient is positioned on the table 612. When scanning is performed for the imaging, the radio-frequency transmitting coil 614 transmits a radio-frequency pulse for excitation to the layer of the imaging volume and excites the layer. The gradient coil assembly 616 applies a magnetic field gradient in a phase encoding direction (such as the Y direction) so as to perform phase encoding on a magnetic resonance signal of the excited layer. The gradient coil assembly 616 applies a gradient field in a frequency encoding direction (such as the X direction) of the object 66 so as to perform frequency encoding on the magnetic resonance signal of the excited layer.

The data acquisition unit 617 is configured to acquire the magnetic resonance signal (for example, received by the body coil or a surface coil) in response to a data acquisition control signal of the controller 620. In an embodiment, the data acquisition unit 617 may include, for example, a radio-frequency preamplifier, a phase detector, and an analog/digital converter, where the radio-frequency preamplifier is configured to amplify the magnetic resonance signal, the phase detector is configured to perform phase detection on the amplified magnetic resonance signal, and the analog/digital converter is configured to convert the phase-detected magnetic resonance signal from an analog signal to a digital signal.

The magnetic resonance imaging system 600 includes an image reconstruction unit 630, and the image reconstruction unit 630 can perform reconstruction on a series of two-dimensional slice images, namely, the aforementioned image sequence, of an imaging volume of the object 66 on the basis of the aforementioned digitized magnetic resonance signal. Specifically, the reconstruction unit may perform the aforementioned image reconstruction on the basis of communication with the controller 120.

The magnetic resonance imaging system 600 includes a processing unit 640, and the processing unit 640 can perform any required image processing on any image in the aforementioned image sequence, such as correcting an image and determining a display parameter of an image. The aforementioned image processing may be an improvement or adaptive adjustment made to an image in any of contrast, uniformity, clarity, brightness, and the like. Specifically, the processing unit 640 may perform the aforementioned image processing on the basis of communication with the controller 620.

In an embodiment, the controller 620, the image reconstruction unit 630, and the processing unit 640 may each or collectively include a computer and a storage medium. A predetermined control program and a data processing program to be executed by the computer are recorded on the storage medium. For example, programs for implementing an imaging scan, image reconstruction, image processing, and the like may be stored on the storage medium. For example, a program for implementing an image display method according to an embodiment of the present invention may be stored on the storage medium. The storage medium may include, for example, a ROM, a floppy disk, a hard disk, an optical disk, a magneto-optical disk, a CD-ROM, or a non-volatile memory card.

The magnetic resonance imaging system 600 may include a display unit 650, and the display unit 650 may be used to display an operation interface and various data or images generated in the data processing process.

The magnetic resonance imaging system 600 further includes a console 660, and the console 660 may include user input devices, such as a keyboard and a mouse. The controller 620 may communicate with the scanner 610, the image reconstruction unit, the processing unit 640, the display unit 650 and the like in response to a control command of a user generated on the basis of the operating console 660 or an operation panel/button provided on the housing of the main magnet.

Figure 7:
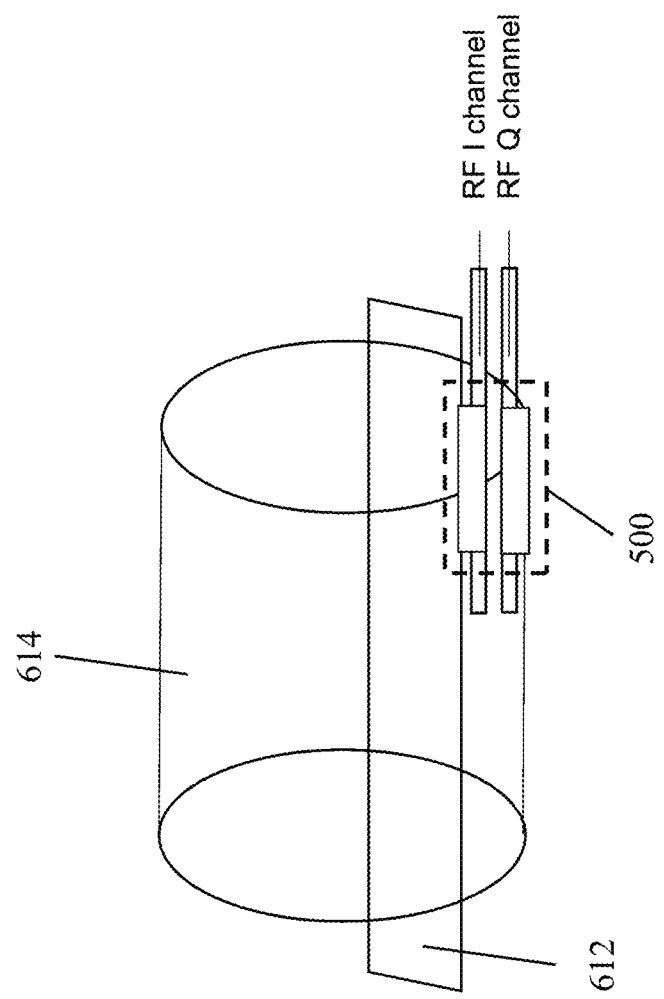
FIG. 7 schematically shows a position of a balun assembly on a radio-frequency transmitting coil in the magnetic resonance imaging system shown in FIG. 6 according to an embodiment of the present utility model.

In some embodiments, the balun assembly in the aforementioned embodiments may be mounted near the radio-frequency transmitting coil 614 of the magnetic resonance imaging system 600, for example, disposed on a transmission line between the radio-frequency transmitting coil 614 and the radio-frequency power amplifier 619. As shown in FIG. 7, in an embodiment, a balun assembly 500 is an important component of the radio-frequency transmitting coil 614, is an important radio-frequency component on a wire connecting the radio-frequency transmitting coil 614 to the radio-frequency power amplifier 619, is a subcomponent of the radio-frequency transmitting coil 614, and is usually located in a magnet. Since the balun assembly according to the embodiment of the present invention has a detachable structure, it is easy to detach and mount the balun assembly during maintenance. In order to further improve ease of maintenance, the balun assembly may also be disposed outside the magnet, for example, in a position outside the magnet and in path I and path Q. The balun assembly 500 may be any one of the balun assemblies encompassed by the claims.

The purpose of providing the above specific embodiments is to allow the content disclosed in the present utility model to be understood more thoroughly and comprehensively, but the present utility model is not limited to these specific embodiments. One skilled in the art should understand that various modifications, equivalent replacements, and changes may also be made to the present utility model. As long as the changes do not violate the spirit of the utility model, they should be included in the scope of protection of the present utility model.

What is claimed is:

1. A balun assembly, comprising:
    an outer conductive tube body disposed around an electrical cable, the outer conductive tube body comprising a first portion and a second portion detachably connected to each other;
    a conductive connection member electrically connecting the outer conductive tube body to an outer conductor of the electrical cable; and
    an insulative material disposed between the outer conductive tube body and the electrical cable.

2. The balun assembly according to claim 1, wherein the outer conductive tube body is coaxial with the electrical cable.

3. The balun assembly according to claim 1, wherein the first portion and the second portion are connected to each other by means of a fastening connection member.

4. The balun assembly according to claim 1, wherein the conductive connection member is integrally formed with the outer conductive tube body.

5. The balun assembly according to claim 4, wherein the outer conductive tube body comprises an axially extending portion and a radially extending portion, and the conductive connection member comprises a plurality of contacts extending integrally from an inner wall of the axially extending portion or a plurality of contacts extending integrally from an inner wall of the radially extending portion.

6. The balun assembly according to claim 5, wherein the contact comprises an elastic piece structure, and the plurality of contacts are evenly distributed in a substantially circumferential direction of the outer conductive tube body, and contact the outer conductor of the electrical cable at a plurality of positions in a circumferential direction of the electrical cable.

7. The balun assembly according to claim 1, wherein the insulative material forms an inner wall substantially adapted to the electrical cable so as to support the electrical cable.

8. The balun assembly according to claim 1, wherein the balun assembly further comprises a capacitor electrically connected to the outer conductive tube body.

9. The balun assembly according to claim 1, wherein the balun assembly further comprises a heat dissipation structure connected to the outer conductive tube body, the heat dissipation structure comprising a first heat sink connected to the first portion and a second heat sink connected to the second portion.

10. A magnetic resonance imaging system, comprising the balun assembly according to claim 1.

* * * * *